United States Patent [19]

St. Onge et al.

[11] Patent Number: 4,814,698
[45] Date of Patent: Mar. 21, 1989

[54] TECHNIQUE FOR ELIMINATION OF STATIC IN PRINTED CIRCUIT BOARD TEST FIXTURES

[75] Inventors: Gary F. St. Onge, Amsterdam; Robert D. McRay, Scotia, both of N.Y.

[73] Assignee: Everett/Charles Contact Products, Inc., Pomona, Calif.

[21] Appl. No.: 108,730

[22] Filed: Oct. 14, 1987

[51] Int. Cl.$^4$ .................. G01R 31/02; H05K 7/18
[52] U.S. Cl. ...................... 324/158 F; 324/73 PC; 361/212
[58] Field of Search .......... 324/158 F, 73 PC, 158 P; 361/212, 220

[56] References Cited

U.S. PATENT DOCUMENTS

| | | | |
|---|---|---|---|
| 4,352,061 | 9/1982 | Matrone | 324/158 F |
| 4,563,722 | 1/1986 | Maroney et al. | 361/212 |
| 4,566,325 | 1/1986 | Rante | 324/73 PC |
| 4,618,222 | 10/1986 | Eisenberg | 361/212 |

Primary Examiner—Ernest F. Karlsen
Attorney, Agent, or Firm—Christie, Parker & Hale

[57] ABSTRACT

A test fixture for use in computerized automatic test equipment for checking printed circuit boards. Substances are used to constitute some of the test fixture parts and to coat others which are effective in preventing damage from electrostatic charges. The substance must be permanent, substantially independent of humidity for its antistatic characteristics, and have a resistivity in the range of $10^5$–$10^{10}$ ohms/sq.

18 Claims, 2 Drawing Sheets

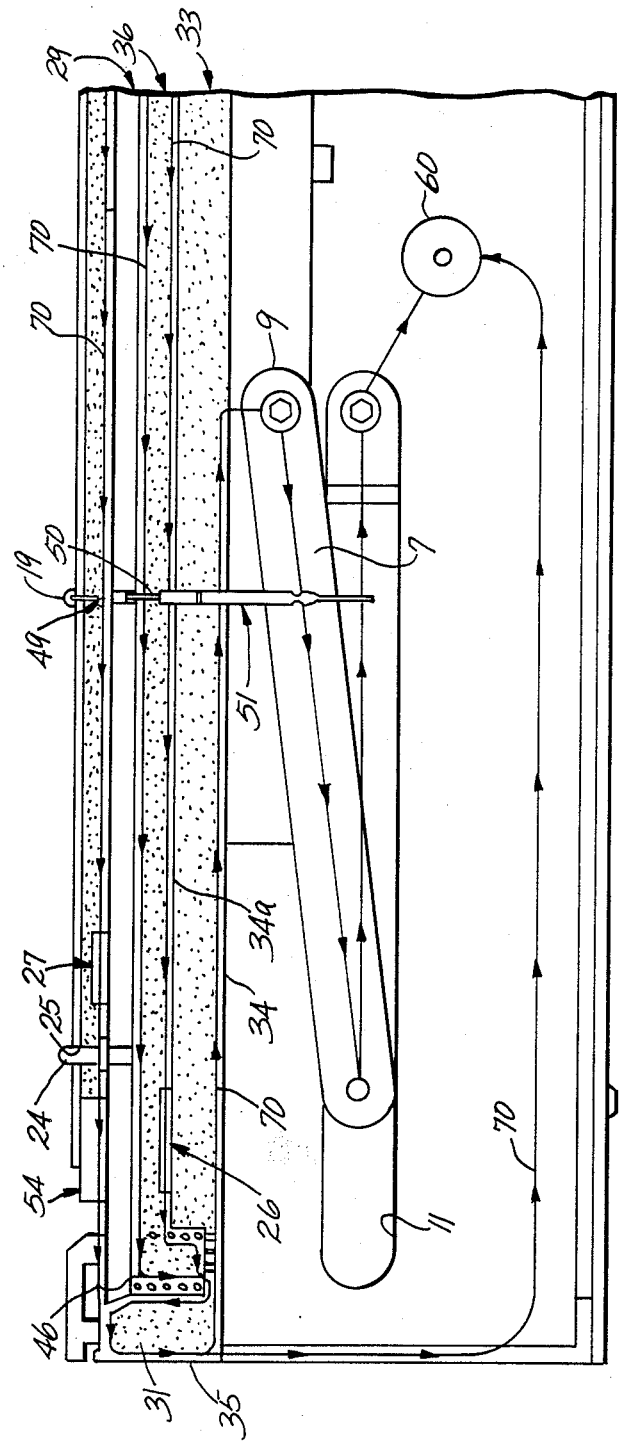

TECHNIQUE FOR ELIMINATION OF STATIC IN PRINTED CIRCUIT BOARD TEST FIXTURES

BACKGROUND OF THE INVENTION

The present invention is related to a test fixture for use in computerized automatic test equipment for checking printed circuit boards and, more particularly, to such a fixture which has been specially adapted to prevent damage from electrostatic charges to circuits and components mounted on it and to the tester circuitry.

Automatic test equipment for checking printed circuit boards has long been well known. For the sake of consistency and convenience, the printed circuit board and the circuitry thereon to be checked such as components and lead lines therebetween, will be referred to hereafter as a "unit under test", or "UUT". A standard and well known test approach utilizes a "bed of nails" test fixture in which a great number of arrayed, nail-like test probes is provided, each having a tip arranged to make electrical contact with a designated test point of the UUT. Any particular circuit laid out on a printed circuit board is likely to be different from all other circuits. Consequently, a "bed of nails" arrangement for contacting test points in a particular circuit must be customized for that circuit. When the circuit to be tested is designed, a pattern of test points to be used in checking it is selected, and a corresponding array of test probes is configured in a fixture. The typical fixture may have five-hundred test probes, and some even go up to two-thousand in number. An exemplary type of such test fixtures is available from Factron Schlumberger in Latham, N.Y. under the mark Thinline.

It is commonly known that electrostatic discharges can cause serious damage to semiconductor devices. Damage can occur by way of junction burnout when a localized voltage is induced by an electrostatic potential. If a sufficient current flows due to the induced electrostatic potential, thermal secondary breakdown can occur, thereby destroying the junction. Another type of damage is dielectric breakdown which occurs when the induced potentials are of a magnitude high enough to "punch through" the insulating layer of silicon dioxide which protects the gate of FETs and MOS-type semiconductors. Furthermore, metalization melt is another type of damage due to electrostatic discharge. Bond wires or metalization strips within the semiconductor burn out, like a fuse, when high currents induced by the electrostatic potential occur.

Various sources for developing an electrostatic potential exist in the work place. For example, electrostatic charge can accumulate due to the well known triboelectric effect generated during the normal act of walking across, for example, the surface of a rug. The worker accumulates a charge which creates a field between himself and nearby grounded objects. Any objects placed in that field will have a voltage induced on them depending on their size and orientation. Such a voltage can easily exceed five-thousand volts. Likewise, if a worker with such an accumulated static charge on him touches an electronic component, currents will flow through the semiconductor of the component and eventually to ground. The resultant voltage can cause dielectric breakdown or melt metalization.

It has been learned relatively recently that circuits are exposed to potentially damaging electrostatic charges in the course of being checked on automatic test equipment of the type such as briefly described above. An electrostatic charge can be built up on the printed circuit board as it is being moved from one location to another due to, for example, the triboelectric effect discussed above which occurs as the person carrying it walks along. Also, when vacuum is used to exert a force on the UUT to engage it against the bed of nails, air rushes through vents in the test fixture during the application of vacuum as well as the release of a vacuum. The friction of air particles moving against fixture surfaces is a source of electrostatic charge build-up. Furthermore, various fixture seals undergo a certain degree of motion as the vacuum is applied and the UUT is brought into engagement with the "bed of nails". This motion is a further source of electrostatic charge build-up.

Electrostatic voltages generated by the above-described causes can reach as high as one thousand volts from the top plate and up to five-thousand volts inside the vacuum well of the fixture. Such electrostatic potentials far exceed the static susceptibility range of MOS-FET chips (100 to 200 volts) as well as ECL bi-polar devices (up to 500 volts). A further concern besides rendering the semiconductor components inoperative is the electrostatic overstress effect. It can be caused even by an electrostatic charge which is only 25% of the static susceptibility values mentioned just above. This effect is such that the components seem to have survived the static without damage. However, it can cause parametric degradation, as well as cause the component to fail well before its specified mean time between failures. As integrated circuits are made with ever finer lines and ever thinner oxide layers, the danger of static will further aggravate the electrostatic overstress effect.

In order to protect the UUT from being damaged during the testing operation, it is desirable to accomplish several aims. Since it is not unlikely that an electrostatic charge will somehow accumulate on the test fixture, it is desirable to dissipate that charge relatively quickly, but not instantaneously such as undesirably occurs in an electostatic discharge to ground with its attendant damaging effects. It is also desirable to prevent the test fixture itself from generating an electrostatic charge during operation of the automatic test equipment. In addition, if an undissipated electrostatic charge remains on the test fixture, it is desirable to prevent a spark from passing from the UUT to the test fixture when, for example, the operator brings the UUT towards the test fixture for mounting thereon.

Various approaches have been developed in an attempt to effectively deal with the electrostatic charges developed on a test fixture due to a variety of causes including those mentioned above. One approach is to ground the operator, such as by a wrist strap connected to ground. Although this eliminates the build-up of electrostatic charges due to the effect of the worker, it completely fails to deal with the other causes listed above. Another approach utilizes an ionizer to blow ionized air across the fixture. However, its effect has been found to be limited because of the inability to access areas beneath the UUT where static charge is actually generated. In yet another approach, an antistatic spray is applied to the fixture. However, this requires disassembly of the fixture which is a somewhat laborious operation. Also, the spray has to be reapplied relatively frequently, such as at one-week intervals because it rubs off easily, evaporates (i.e. sublimes) or its electrical characteristics degrade. Also, such sprays are humidity dependent in their ability to prevent static buildup. Thus, each of the prior art approaches suffers from certain disadvantages which render it insufficiently effective or inconvenient and overly time consuming to use. Consequently, an improved approach is highly sought after.

SUMMARY OF THE INVENTION

It is a primary object of the present invention to provide a test fixture for automatic test equipment that is capable of preventing damage to a UUT due to an electrostatic discharge.

A further object of the present invention is to provide a test fixture which inhibits a build-up of electrostatic charges during operation of the automatic test equipment, particularly when vacuum is applied and/or released.

A further object of the present invention is to provide a test fixture which inhibits a spark from discharging from the UUT to the test fixture when one is brought toward the other.

Yet another object of the present invention is to safely dissipate any electrostatic charge which may have accumulated on the test fixture.

Still another object of the present invention is to prevent static damage to the input circuitry of the tester on which the fixture is mounted.

These and other objects of the present invention are attained by a test fixture for checking a printed circuit board comprising a housing, an array of electrically conductive pins, means for mounting the array of electrically conductive pins to the housing, means for mounting a printed circuit board test unit to the housing in spaced relationship to the array of electrically conductive pins, motive means, including a vacuum area, for bringing at least one of the printed circuit board test unit and the array of electrically conductive pins toward the other, and an antistatic substance on a substantial portion of the surface area of the housing, mounting means, and motive means, the substance having a resistivity in the range of $10^5$–$10^{10}$ ohms/sq., and being substantially independent of humidity for its antistatic characteristic.

BRIEF DESCRIPTION OF THE DRAWINGS

FIG. 2 is a view in section taken along line A—A' in FIG. 1.

DETAILED DESCRIPTION OF THE PREFERRED EMBODIMENT

Figure 1:
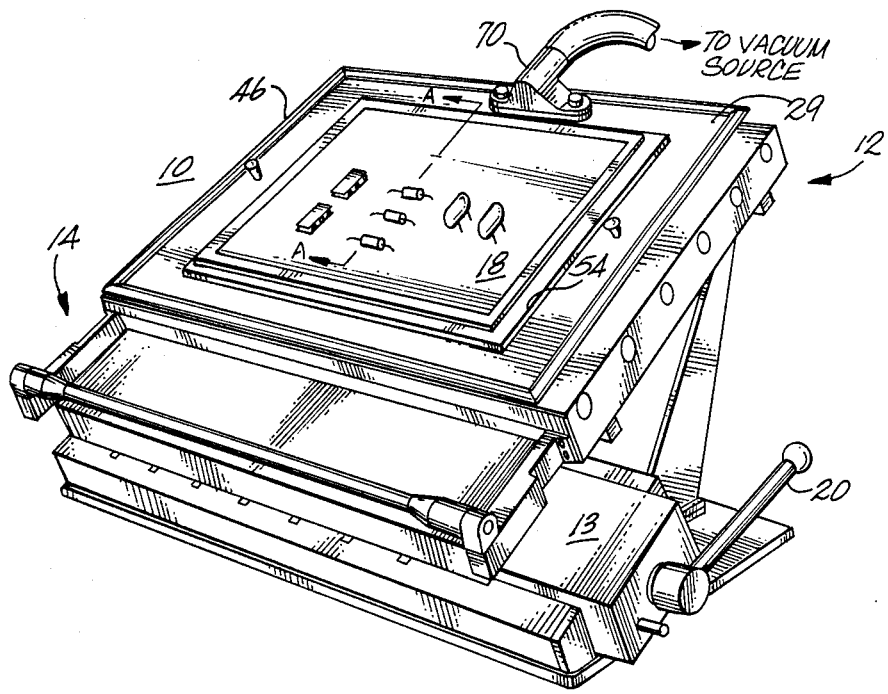
FIG. 1 is a perspective view of an exemplary test fixture mounted in an assembly for placing it in communication with a computerized automatic test equipment system.

FIG. 1 shows a test fixture generally identified as 10. A system access portion, or contact panel, 14 is adapted to be mounted onto a receiver 13. Receiver 13 is fixed to the automatic test equipment and includes pins to which the computerized system (not shown) is connected. A lever 20 is utilized to bring corresponding pins in the contact panel 14 and in receiver 13 into engagement. A UUT access portion 12 is offset from the system access portion 14. This particular type of fixture is sold by Factron Schlumberger of Latham, N.Y. under the Thinline brand. Although the disclosure made herein is specific to that type of "bed of nails" test fixture, it should be understood that the present invention applies to other types of test fixtures as well, such as those having a system access portion aligned with a UUT access portion.

As shown in FIGS. 1 and 2, UUT access portion 12 carries a UUT 18 having various electronic devices 19 mounted thereon. A movable plate 29 is provided along its entire outer periphery with a gasket 46. UUT 18 is above movable plate 29 and separated therefrom by a sealing gasket 54 on which UUT 18 rests. Gaskets 46 and 54 assist in forming and maintaining a vacuum under the UUT, as described below. Hose 71 is connected to a vacuum source (not shown). When the vacuum is activated, it produces forces as a result of which UUT 18 is lowered onto a bed of nails, such as shown in FIG. 2. Other details of contact panel 14, receiver 13, and associated components can be found in U.S. Pat. No. 4,352,061 issued to John L. Matrone on Sept. 28, 1982 and in the brochure, "Thin Line Vacuum Fixture Systems and Contact Test Probes" identified as BJM 3422 5M 1286, both of which are hereby incorporated by reference.

The details described up to this point are merely exemplary and form no part of the present invention. It must be stressed that they are presented only for providing one test fixture environment, out of others which are known and available, for explaining the present invention succinctly and with clarity. Details disclosed in U.S. Pat. No. 4,352,061 are illustrative of a test fixture having a system access portion and UUT access portion, and such details should not in any way be considered in the context of limiting the present invention.

FIG. 2 is a cross-sectional side view of a test fixture used for illustrating the principles of the present invention. The UUT 18 rests on a gasket 54, and is accurately positioned on the test fixture by guide pins 24 (only one of which is shown) accommodated within openings 25 in UUT 18. A circuit component 19 is shown in its mounted position on UUT 18. Gasket 54 and guide pins 24 are fixedly secured to a moving top plate 29 resiliently mounted by springs 31 (one of which is shown) to vacuum well 33. Vacuum well 33 is a solid piece with a bottom surface 34, top surface 34a and side wall 35. Vacuum well 33 forms a cavity 36 into which movable plate 29 can be drawn. Gasket 46 is attached (as by an adhesive, for example) to moving plate 29 and sits on wall 35 of vacuum well 33 in an airtight manner so as to maintain a vacuum within cavity 36 when the vacuum source is activated. Test probe 50 has one end slidably received in test probe receptacle 51 and is resiliently urged upward (by a spring, not shown, in test probe 50) to bring probe tip 49 into contact with the UUT during actuation of the test fixture. Thus, when air is evacuated by the vacuum source (not shown) from cavity 36, a sealing action is performed by gasket 46 and 54. The force created by that vacuum within cavity 36 is communicated to the UUT via holes in moving plate 29 which are wider than contact tip 49 of test probe 50. As a result UUT 18 is pressed down onto gasket 54. Also, movable plate 29 is forced to descend against the opposed resilient force applied by springs 31 as they are compressed. As movable plate 29 descends, the gasket 46 flexes enough to travel along with moving plate 29 so that the vacuum in cavity 36 is not impaired.

The test fixture is also provided with hard rubber stops 26 and 27. Stops 26 are mounted on top surface 34 of vacuum well 33. They abut against movable plate 29 as the latter is drawn downward by the applied vacuum. Stops 27 are mounted on the top surface of movable plate 29, and they abut against UUT 18 when the latter is also drawn downward during the application of vacuum. Stops 27 are brought into play due to the compressibility of gasket 54, whereas stops 26 are brought into play due to the resilience of springs 31.

Test fixture 10 includes a hinged top plate which can be raised relative to housing 5 from its position as depicted in FIG. 2. The various components described up to this point above are housed in the hinged top plate to facilitate access to the underside of vacuum well 33 and test probes 50 mounted therein so that the necessary wire connections can be made. Hinge Bar 7 is rotatably mounted to the test fixture by pin 9, and has its other end rotatably mounted to hinge bar 11. As the top of the test fixture is raised, bars 7 and 11 move in a well known manner.

With one type of test fixture having been described above, this description can now proceed to the essence of the present invention. Its principal feature lies in using a substance, such as for coating various parts of the test fixture, that has been selected for its following characteristics: (1) permanency, (2) a lack of dependence on the level of humidity for its antistatic characteristic, and (3) resistivity range.

The feature of permanence is advantageous for the obvious reason that the substance does not degrade electrically or wear out mechanically and it, therefore, need not be reapplied at relatively frequent intervals. Physically, its adhesion is such that it does not significantly wear due to abrasion. Its expected usable lifetime is that of the mechanical life of the test fixture. Electrically, its resistive properties do not degrade appreciably whereas, in the prior art, no more than 30 days of usefulness is obtained in terms of electrical performance.

The fact that the substance is independent of humidity is highly advantageous relative to prior art approaches which do depend on humidity and are, therefore, deficient (in terms of dissipating static) in dry conditions such as are common, for example, in the southwest portion of the U.S.

The resistivity of the coating applied to most parts of the test fixture is $10^9$–$10^{10}$ ohms/square, although it can be anywhere in the range of $10^5$–$10^{10}$ ohms/square. The resistivity in this range of values allows the static to bleed off 5000 volts down to 50 volts in approximately 100 ms. However, even though the resistivity is low enough to satisfactorily dissipate static, it is still high enough to prevent direct discharge from the UUT to ground.

Although the resistivity value of the coating applied to surfaces of the test fixture is as described just above, gasket 54 is an exceptional case because it comes into direct contact with UUT 18. A resistivity of even up to $10^{10}$ ohms/square may deleteriously affect the test results. Consequently, a gasket having a resistivity of $10^{10}$–$10^{12}$ ohms/square is applied to movable plate 29. Stops 27, which also come into contact with UTT 18, are likewise made of a material with a resistivity of $10^{10}$–$10^{12}$ ohms/square.

One type of coating which satisfies the above requirements is made of a polyester/polyurethane static dissipative coat available from the Eastman Kodak Company under the brand EK-STAT. However, any plastisol coating having the appropriate resistivity may be satisfactory as well. If color is desirable, it can be provided with an epoxy polyamid coat under the EK-STAT coat. Alternatively, the particular fixture part can be molded in color.

Figure 3:
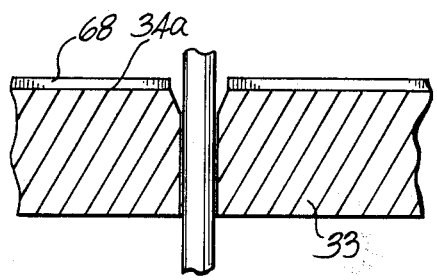
FIG. 3 is a blow up of the circled area B in FIG. 2.

The coating is applied by spraying it onto the various surfaces of the test fixture, or the test fixture is dipped into it. FIG. 3 shows the coating 68 applied to the top surface 34a of vacuum well 33. The coating also wraps around vacuum well 33 and covers 1 to 1½ inch at the outer periphery of bottom surface 34. The rest of the bottom surface 34 remains uncoated. The coating makes all relevant surfaces of the test fixture permanently static dissipative, rather than conductive. The surfaces to which the coating is applied include not only the exposed, external surfaces, but also internal surfaces where air flow might induce an electrostatic charge as well. In particular, the top plate 29, vacuum well 33, and the housing 5 are all coated with the static-dissipative substance, and the gaskets 46, 54 as well as stops 26, 27 are made of an antistatic material. The vacuum manifold (not shown) is made of a static dissipative material.

An electrostatic charge which might accumulate on the test fixture by the effects enumerated above is quickly dissipated through the coating to a ground in the frame of the automatic test equipment. Alternatively, it is dissipated to a ground connection point 60 on the side of housing 5. Various paths for dissipation of the electrostatic charge are shown by lines 70 the direction of flow of which is specified by arrows.

As shown in FIG. 2, the periphery of test probe receptacle 51 can come into contact with the antistatic coating applied to top surface 34a of vacuum well 33. This contact between the coating and the test probe could deleteriously affect testing of high impedance analog or digital circuitry. Consequently, and as shown in FIG. 3, the top surface 34a of vacuum well 33 is preferably milled, spot faced, or counter-drilled away to create a space between the coating and the test probe in order to obviate this problem.

Although parts of the test fixture can be made of metal if it is coated with the anti-static substance discussed above, it is preferable that as many parts as possible of the test fixture be made of an insulating material. If metal is used, the electrostatic charge could "punch through" the coating. Insulating materials which preferably constitute the test fixture are Lexan (a mark of General Electric) for housing 5, bulk molding compound (BMC) for the vacuum well 33, sheet molding compound (SMC) for moving top plate 29, STAT-KON 3340 conductive polypropylene from LNP Corp., Malvern, Pa. for the vacuum manifold, 70 Durometer black neoprene mechanical rubber P/N MR70E238N for internal hard stops 26 and gasket 46, poron cellular urethane #4701-01-15188-1604 from Rogers Corp., Rogers, Conn. for gasket 54, and plastisol VP 400 from LOES Enterprises in St. Paul, Minn. for hard stops 27.

A further feature of the present invention is designed to inhibit the electrostatic charge build-up as air rushes into the test fixture when the vacuum is released. As explained above, the friction occuring as air containing particulate matter moves across fixture surfaces can also be a source of electrostatic charge build-up. Consequently, the air inlet(s) is (are) can be provided with a metal screen. The screen is connected to ground or, alternatively, it is connected to the coating in order to bleed away any static charge carried by the air into the fixture.

Although a preferred embodiment of the present invention has been discussed in detail above, it should be readily apparent to anyone with ordinary skill in the art that various modifications thereto can be readily made. Such modifications are intended to fall within the scope of the present invention as defined by the following claims.

We claim:

1. A test fixture for inhibiting build up and retention of electrostatic charges during use and for preventing electrostatic discharge damage to a printed circuit board tested on the fixture, comprising:
   a housing having hollow interior;
   an array of electrically conductive test probes mounted within the hollow interior of the housing;
   support means sealed to the housing for mounting a printed circuit board to the housing spaced from the array of test probes, the support means and test probes being movable toward one another;
   a vacuum area being formed between the interior of the housing and the printed circuit board mounted to the support means so that a vacuum applied to the vacuum area draws the array of test probes and the supported printed circuit board toward one another and into contact for testing, and in which release of the vacuum separates the test probes from the board under test; and
   an antistatic substance on a substantial portion of the surface area of the housing interior and the support means exposed to the vacuum area, the antistatic substance being permanently static dissipative and substantially independent of humidity for its antistatic characteristics and having a resistivity in the range of $10^5$–$10^{10}$ ohms/square sufficient for controllably dissipating electrostatic charges from the surface areas exposed to the vacuum area of the test fixture when said vacuum is applied and released during operation of the test fixture and for additionally inhibiting electrostatic discharge from the printed circuit board to the test fixture.

2. The test fixture of claim 1 wherein the antistatic substance is a coating applied to said surface area.

3. The test fixture of claim 2, wherein said coating has permanent electrical properties.

4. The test fixture of claim 3, wherein said coating is substantially wear resistant.

5. The test fixture of claim 4, wherein the electrical resistivity of said coating is $10^9$–$10^{10}$ ohms/sq.

6. The test fixture of claim 2, wherein said coating is substantially wear resistant.

7. The test fixture of claim 2, wherein the electrical resistivity of said coating is $10^9$–$10^{10}$ ohms/sq.

8. The test fixture of claim 1, wherein the resistivity of all portions of the means for supporting the printed circuit board which are in contact with the printed circuit board is $10^{10}$–$10^{12}$ ohms/sq.

9. The test fixture of claim 1 further comprising a connection to ground in electrical contact with said antistatic substance.

10. The test fixture of claim 1, wherein the antistatic substance is spaced from said electrically conductive pins to be electrically isolated therefrom.

11. The test fixture of claim 1, in which the support means comprises a support plate, a resilient gasket for sealing the support plate to the printed circuit board, and stop means on the support plate for contacting the printed circuit board and in which at least a portion of the vacuum area is between the support plate and the printed circuit board;
   in which the antistatic substance covers the surface area of the support plate adjacent the printed circuit board; and
   in which the resistivity of the stop means and the gasket are in the range of about $10^{10}$–$10^{12}$ ohms/square.

12. The test fixture of claim 11 in which the support plate is movable toward the test probes.

13. The test fixture of claim 12 in which the test probes pass through the movable support plate for contact with the circuit board, and air passes between the test probes and the support plate when the vacuum is applied to draw the board into contact with the test probes.

14. The test fixture according to claim 12 in which the support plate is spaced from the interior of the housing; and including a further stop means between the interior of the housing and the movable support plate;
   in which a further portion of the antistatic substance covers the surface area of the interior of the housing and the surface area of the support plate facing one another; and
   in which the resistivity of the further stop means is in the range of about $10^5$–$10^{12}$ ohms/square.

15. The test fixture of claim 1 in which the antistatic substance comprises a polyester/polyurethane static-dissipative coating.

16. The test fixture of claim 1 in which the antistatic substance comprises a plastisol coating.

17. A test fixture for inhibiting build up and retention of electrostatic charges during use and for preventing electrostatic discharge damage to a printed circuit board tested by the test fixture, comprising:
   a housing having a hollow interior;
   an array of electrically conductive test probes mounted within the hollow interior of the housing;
   a support plate sealed to the housing for mounting a printed circuit board in a position normally spaced from the array of test probes, the support plate and test probes being movable toward one another;
   a resilient gasket for sealing the support plate to the printed circuit board;
   first stop means on the support plate for contacting the printed circuit board during use of the test fixture;
   a vacuum area being formed between the interior of the housing and the printed circuit board mounted to the support plate so that a vacuum applied to the vacuum area draws the array of test probes and the supported printed circuit board toward one another and into pressure contact for testing, and in which release of the vacuum separates the test for probes from the board under test;
   second stop means between the interior of the housing and the support plate; and
   an antistatic substance on a substantial portion of the surface area of the housing interior and the support plate exposed to the vacuum area, the antistatic substance being permanently static-dissipative and substantially independent of humidity for its antistatic characteristics and having a resistivity in the range of $10^5$–$10^{10}$ ohms/square sufficient for controllably dissipating electrostatic charges from the surface areas exposed to the vacuum area of the test fixture when said vacuum is applied and released during the operation of the test fixture and for additionally inhibiting electrostatic discharge from the printed circuit board to the test fixture;

in which at least a portion of vacuum area is between the support plate and the printed circuit board;

in which the resistivity of the first stop means and the resilient gasket for contact with the board under test are in the range of about $10^{10}$–$10^{12}$ ohms/square; and in which the resistivity of the second stop means is in the range of $10^5$–$10^{12}$ ohms/square.

18. The test fixture of claim 17 in which the test probes pass through the support plate for contact with the circuit board, and air passes between the test probes and the support plate when the vacuum is applied to draw the test probes into contact with the board; and in which the air passing through the support plate is a source of induced static charges which are inhibited by the antistatic substance.

* * * * *